US011280001B2

(12) United States Patent
Kilpi et al.

(10) Patent No.: US 11,280,001 B2
(45) Date of Patent: *Mar. 22, 2022

(54) SUBSTRATE LOADING IN AN ALD REACTOR

(71) Applicant: Picosun Oy, Espoo (FI)

(72) Inventors: Vaino Kilpi, Espoo (FI); Juhana Kostamo, Espoo (FI); Wei-Min Li, Espoo (FI)

(73) Assignee: Picosun Oy, Espoo (FI)

( * ) Notice: Subject to any disclaimer, the term of this patent is extended or adjusted under 35 U.S.C. 154(b) by 250 days.

This patent is subject to a terminal disclaimer.

(21) Appl. No.: 16/165,303

(22) Filed: Oct. 19, 2018

(65) Prior Publication Data

US 2019/0048465 A1    Feb. 14, 2019

Related U.S. Application Data

(63) Continuation of application No. 14/646,504, filed as application No. PCT/FI2012/051160 on Nov. 23, 2012, now Pat. No. 10,161,038.

(51) Int. Cl.
*C23C 16/455* (2006.01)
*H01L 21/677* (2006.01)
(Continued)

(52) U.S. Cl.
CPC .... *C23C 16/45546* (2013.01); *C23C 16/4582* (2013.01); *C23C 16/4584* (2013.01);
(Continued)

(58) Field of Classification Search
CPC .......... C23C 16/45546; C23C 16/4582; C23C 16/4584
See application file for complete search history.

(56) References Cited

U.S. PATENT DOCUMENTS 5,603,777 A * 2/1997 Ohashi ................. B08B 3/045
134/25.4
5,836,736 A 11/1998 Thompson et al.
(Continued)

FOREIGN PATENT DOCUMENTS

CN    101847594 A    9/2010
EA     015231 B1    6/2011
(Continued)

OTHER PUBLICATIONS

Decision to Grant a Patent received for Japanese Patent Application No. 2017-042486, dated Oct. 30, 2018, total 5 pages including 2 pages of English Translation.
(Continued)

*Primary Examiner* — Kelly M Gambetta
(74) *Attorney, Agent, or Firm* — Ziegler IP Law Group, LLC

(57) ABSTRACT

An apparatus and method for loading a plurality of substrates into a substrate holder in a loading chamber of a deposition reactor to form a vertical stack of horizontally oriented substrates within said substrate holder, for turning the substrate holder to form a horizontal stack of vertically oriented substrates, and for lowering the substrate holder into a reaction chamber of the deposition reactor for deposition. The technical effects achieved are: a top loading system for a vertical flow deposition reactor in which the substrates can be loaded with horizontal orientation, eliminating the need for flipping each substrate separately by flipping the whole substrate holder and minimizing a loading distance in a reactor cluster.

18 Claims, 6 Drawing Sheets

(51) Int. Cl.
   *H01L 21/687*   (2006.01)
   *C23C 16/458*   (2006.01)
(52) U.S. Cl.
   CPC .. *H01L 21/67742* (2013.01); *H01L 21/67757* (2013.01); *H01L 21/67781* (2013.01); *H01L 21/68707* (2013.01)

(56) References Cited

U.S. PATENT DOCUMENTS

| | | | |
|---|---|---|---|
| 7,337,792 B2 * | 3/2008 | Kamikawa | H01L 21/67781 134/148 |
| 2001/0012481 A1 | 8/2001 | Davis | |
| 2003/0164179 A1 | 9/2003 | Kamikawa et al. | |
| 2005/0121142 A1 * | 6/2005 | Nakao | H01L 21/67057 156/345.29 |
| 2009/0016853 A1 | 1/2009 | Yoo | |
| 2010/0028122 A1 * | 2/2010 | Lindfors | H01L 21/67757 414/806 |
| 2010/0212593 A1 | 8/2010 | Takebayashi et al. | |
| 2011/0318489 A1 | 12/2011 | Ishizu et al. | |
| 2012/0308346 A1 * | 12/2012 | Keigler | H01L 21/67034 414/222.09 |
| 2013/0122720 A1 | 5/2013 | Takebayashi et al. | |
| 2013/0302115 A1 | 11/2013 | Wakabayashi et al. | |

FOREIGN PATENT DOCUMENTS

| | | | |
|---|---|---|---|
| JP | H-0294647 A | * | 9/1988 |
| JP | H01-253232 A | | 10/1989 |
| JP | H02-94647 A | | 4/1990 |
| JP | H03-125453 A | | 5/1991 |
| JP | H08-17894 A | | 1/1996 |
| JP | H11111836 A | | 4/1999 |
| JP | 2000286321 A | | 10/2000 |
| JP | 2003-257923 A | | 9/2003 |
| JP | 2004281613 A | | 10/2004 |
| JP | 2005-123315 A | | 5/2005 |
| JP | 2010-186904 A | | 8/2010 |
| JP | 2011-523444 A | | 8/2011 |
| JP | 2011-530003 A | | 12/2011 |
| JP | 2012-174763 A | | 9/2012 |
| JP | 2012-186485 A | | 9/2012 |
| KR | 20100071550 A | * | 6/2010 |
| RU | 2003133288 A | | 5/2005 |
| RU | 2258764 C1 | | 8/2005 |
| SU | 1093728 A | | 5/1984 |
| TW | 201243099 A | | 11/2012 |
| TW | 201243985 A | | 11/2012 |
| WO | 99/25004 A1 | | 5/1999 |
| WO | 2012136875 A1 | | 10/2012 |
| WO | 2012/136875 A8 | | 12/2012 |

OTHER PUBLICATIONS

Search report received for Chinese Patent Application No. CN2012800772542, dated Aug. 29, 2016, 4 pages including 2 pages of English translation.
Extended European Search Report received for European Patent Application No. EP12888893.0, dated Jun. 8, 2016, 09 pages.
Search Report received for Federal Institute of Industrial Property 2015122215, dated Oct. 11, 2016, 08 pages.
International Preliminary Report on Patentability and Written Opinion received for PCT/FI2012/051160, dated May 26, 2015, 9 pages.
International Search report received for International Patent Application No. PCT/FI2012/051160, dated Jun. 25, 2013, 7 pages.
Office Action received for Japanese Patent Application No. 2015-543487, dated Jul. 20, 2016, 9 pages including 6 pages on English translation.
Office Action received for Japanese Patent Application No. 2017-042486, dated Feb. 1, 2018, 5 pages including 3 pages on English translation.
Kunil, Yasuo, et al., "Veritcal SiGe Epitaxial Growth System", vol. 51, No. 02, 2002, pp. 104-108.
Extended European Search Report received for European Patent Application No. EP18202273.1, dated Feb. 12, 2019, 8 pages.
Summary of the Decision of Rejection, Application No. 2018222990, dated Jan. 8, 2020.
Office Action received for Japanese Patent Application No. 2018-222990, dated Aug. 20, 2019, 7 pages including 3 pages of English translation.

* cited by examiner

SUBSTRATE LOADING IN AN ALD REACTOR

FIELD OF THE INVENTION

The present invention generally relates to deposition reactors. More particularly, the invention relates to atomic layer deposition reactors in which material is deposited on surfaces by sequential self-saturating surface reactions.

BACKGROUND OF THE INVENTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to at least one substrate.

Thin films grown by ALD are dense, pinhole free and have uniform thickness. For example, in an experiment aluminum oxide has been grown by thermal ALD from trimethylaluminum ($CH_3$)3Al, also referred to as TMA, and water at 250-300° C. resulting in only about 1% non-uniformity over a substrate wafer.

SUMMARY

There are various methods for loading a single substrate or a batch of substrates into a deposition reactor. Now, it has been observed that certain advantages can be achieved if substrates are loaded horizontally oriented into a substrate holder in a loading chamber, and then the substrate holder is turned and lowered into a reaction chamber for deposition.

According to a first example aspect of the invention there is provided a method comprising:

loading a plurality of substrates into a substrate holder in a loading chamber of a deposition reactor to form a vertical stack of horizontally oriented substrates within said substrate holder; and turning the substrate holder to form a horizontal stack of vertically oriented substrates and lowering the substrate holder into a reaction chamber of the deposition reactor for deposition.

In certain example embodiments, the method comprises moving substrates one at a time by a loader through a loading port into the loading chamber. In certain example embodiments, the substrates are moved from a transfer chamber (external to the deposition reactor) into the loading chamber (of the deposition reactor). In certain example embodiments, the substrates travel through a loading port horizontally oriented.

Horizontally oriented basically means that a normal vector of the substrate surface points to a vertical direction. Vertically oriented, to the contrary, basically means that a normal vector of the substrate surface points to a horizontal direction.

The substrates may be wafers. The loader may be a loading person or a loading device, such as a loading robot. The loader may be a single wafer loader. The loading port may be, for example, simply an opening, a hatch or door, or a load lock, depending on the implementation. In certain example embodiments, a loader picks up a substrate from a loading device pick up and return station and transfers (moves) it into the loading chamber. The transfer may occur via a transfer chamber or without passing a transfer chamber. The loader may pick up the substrate from a substrate cassette. The substrates may be horizontally oriented in the cassette. In certain example embodiments, the method comprises loading said substrates from a substrate storage carrier by an equipment front end module into the loading device pick up and return station. The substrates may first reside in a controlled environment, such as within a shield gas atmosphere (for example, nitrogen atmosphere) within the substrate storage carrier, such as a FOUP or similar. The equipment front end module loads the substrates into the loading device pick up and return station keeping the substrates within the controlled environment (shield gas atmosphere). Alternatively, the loading device pick up and return station may be in vacuum. The transfer chamber as well as the loading chamber may be in vacuum. The loading device pick up and return station may contain the substrates horizontally oriented in a cassette. If needed, the loading device pick up and return station may be a cassette-to-cassette station which transfers substrates from one cassette to another cassette from which the loading device may better pick up the substrates one at a time. The loading device pick up and return station may form part of the transfer chamber.

In certain example embodiments, the method comprises:

loading said substrates from a substrate storage carrier by an equipment front end module into a loading device pick up and return station; and loading said substrates one at the time from the loading device pick up and return station via a transfer chamber into the loading chamber.

In certain example embodiments, the deposition reactor comprises a gate between the loading chamber and the reaction chamber. This may be in order to reduce cooling of the reaction chamber during the loading of the substrates into the loading chamber. The gate may be a gate valve. The gate may be in a closed position during the loading of the substrates into the loading chamber. Upon completion of the loading, the gate is opened to allow the loaded substrate batch to be lowered into the reaction chamber. Thereafter, the gate may be closed. These embodiments are particularly suited for reactors in which the loading chamber is on top of the reaction chamber. Accordingly, in certain example embodiments, the method comprises:

providing a gate between the loading chamber and the reaction chamber, the loading chamber residing on top of the reaction chamber.

In certain example embodiments, the reaction chamber is surrounded by a vacuum chamber. In these embodiments, it may be convenient that the gate is located between the vacuum chamber and the loading chamber. If reaction chamber heaters are located in the vacuum chamber, the gate closing the route from the vacuum chamber to the loading chamber (on top of the vacuum chamber) reduces heat transport from the vacuum chamber to the loading chamber. The gate may close the vacuum chamber from the top during the loading of the substrates into the loading chamber.

In certain example embodiments, the turning (or flipping) is arranged so that the turning is a swing-like movement. In certain other example embodiments, the turning may be a rotating movement. Accordingly, in certain example embodiments, the method comprises turning the substrate holder by a rotating movement. In certain example embodiments, the method comprises accessing the substrate holder from a side by an actuator (or more generally herein and in the following, a turning mechanism), and turning the substrate holder by the actuator. In certain example embodiments, the substrate holder comprises a rotation center. The actuator may be pushed in contact with the rotation center and the substrate holder may be rotated around a rotation axis at the rotation center. The rotation axis may be defined by the actuator. In certain example embodiments, the loading chamber provides a feedthrough through a loading chamber wall (for example, sidewall) for the actuator to enter the loading chamber. The actuator may return (move back) via the same feedthrough after turning the substrate holder. If for example heat reflector plates or similar are integrated to a reaction chamber lid, these plates then have more room to pass through. In certain example embodiments, the substrate holder is accessed by a turning mechanism from two opposite sides. The turning mechanism in these embodiments can comprise two opposite actuators and two rotation centers.

In certain other example embodiments, the turning may be a free movement supported by the turning means. In certain example embodiments, the turning is configured to occur within the loading chamber of the deposition reactor.

In certain example embodiments, the turning is arranged so that the substrate holder in a loading position (that is, in the position in which the substrates are being loaded) is closer to loading chamber door (or loading port) than in the turned position (that is, in the position in which the substrates form the horizontal stack). In other words, in certain example embodiments, a loaded substrate holder is turned farther from the loading chamber door.

In certain example embodiments, the method comprises depositing material on the substrate surfaces by sequential self-saturating surface reactions. Accordingly, in certain example embodiments, the method comprises:

exposing the plurality of substrates to temporally separated precursor pulses in the reaction chamber to deposit material on the substrate surfaces by sequential self-saturating surface reactions.

According to a second example aspect of the invention there is provided an apparatus, wherein a loader is configured to load a plurality of substrates into a substrate holder in a loading chamber of a deposition reactor to form a vertical stack of horizontally oriented substrates within said substrate holder, the apparatus comprising:

a turning mechanism configured to turn the substrate holder to form a horizontal stack of vertically oriented substrates and an elevator configured to lower the substrate holder into a reaction chamber of the deposition reactor for deposition.

In certain example embodiments, the turning mechanism comprises, for example, a turning part, or a turning device. The turning mechanism and the elevator may be a combined means or separate means. The turning and lowering may occur simultaneously or one after the other. In certain example embodiments, the loader is configured to move substrates one at a time through a loading port into the loading chamber.

In certain example embodiments, the apparatus comprises:

a gate between the loading chamber and the reaction chamber, the loading chamber residing on top of the reaction chamber.

In certain example embodiments, the apparatus comprises:

an equipment front end module configured to load said substrates from a substrate storage carrier into a loading device pick up and return station; and a loading device configured to load said substrates one at the time from the loading device pick up and return station via a transfer chamber into the loading chamber.

In certain example embodiments, the turning mechanism is configured to turn the substrate holder by a rotating movement.

In certain example embodiments, the turning mechanism is configured to access the substrate holder from a side, and turn the substrate holder.

In certain example embodiments, the apparatus is configured to turn a loaded substrate holder farther from the loading chamber door (compared to a loading position).

In certain example embodiments, the apparatus comprises a plurality of deposition reactors positioned in a pre-determined pattern in relation to each other, and the loading device is configured to load each of the deposition reactors. Thus, a reactor cluster system can be formed.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well. Any appropriate combinations of the embodiments may be formed.

BRIEF DESCRIPTION OF THE DRAWINGS

The invention will now be described, by way of example only, with reference to the accompanying drawings, in which.

DETAILED DESCRIPTION

In the following description, Atomic Layer Deposition (ALD) technology is used as an example. The basics of an ALD growth mechanism are known to a skilled person. As mentioned in the introductory portion of this patent application, ALD is a special chemical deposition method based on the sequential introduction of at least two reactive precursor species to at least one substrate. The at least one substrate is exposed to temporally separated precursor pulses in the reaction chamber to deposit material on the substrate surfaces by sequential self-saturating surface reactions.

A basic ALD deposition cycle consists of four sequential steps: pulse A, purge A, pulse B and purge B. Pulse A consists of a first precursor vapor and pulse B of another precursor vapor. Inactive gas and a vacuum pump are used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be more complex. For example, the cycles can include three or more reactant vapor pulses separated by purging steps. All these deposition cycles form a timed deposition sequence that is controlled by a logic unit or a microprocessor.

Figure 1:
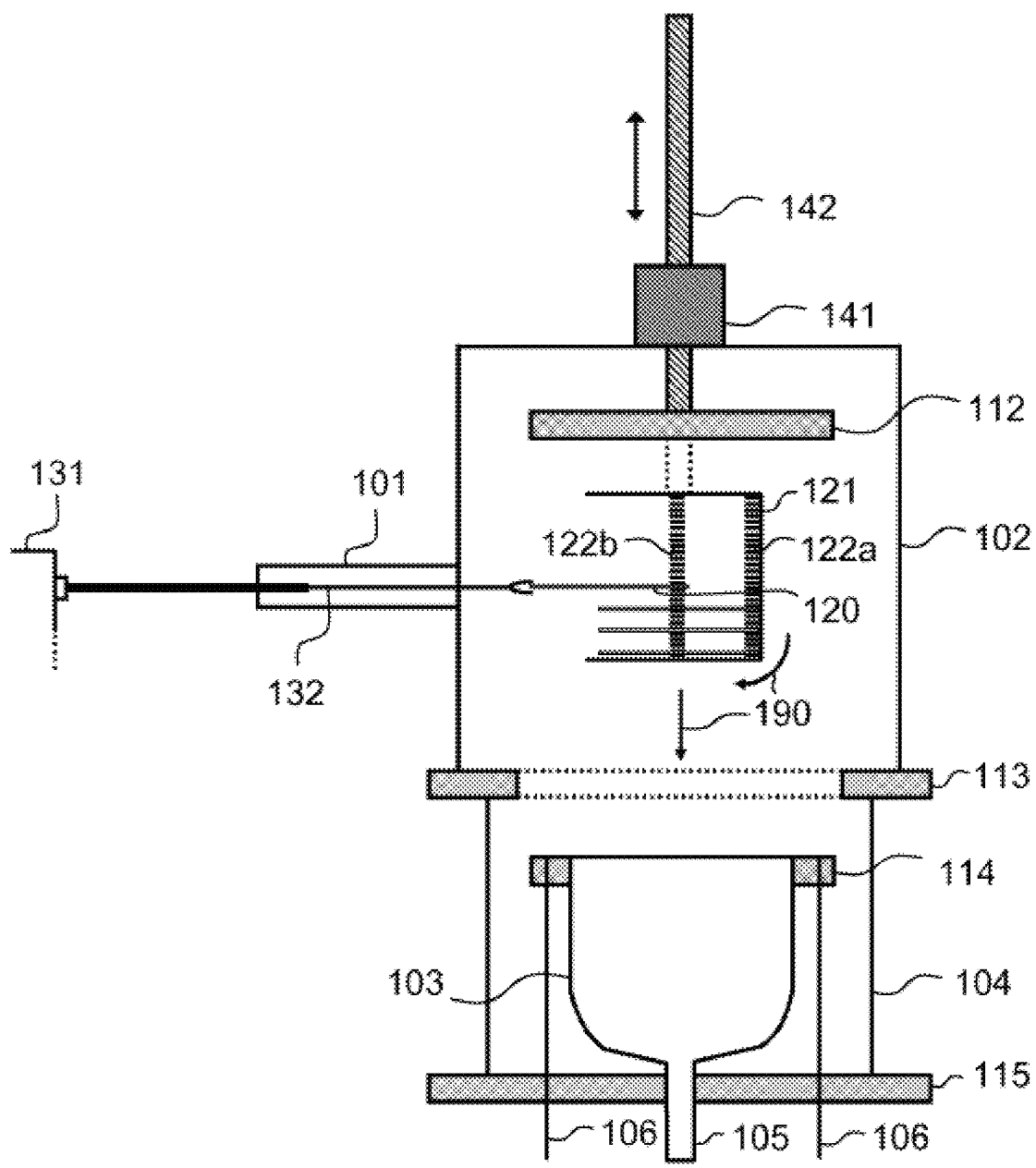
FIG. 1 shows a side view of a deposition reactor and a substrate loader in accordance with an example embodiment.

FIG. 1 shows a side view of a deposition reactor and a substrate loader in accordance with an example embodiment. The deposition reactor comprises a vacuum chamber 104 housing a reaction chamber 103. The vacuum chamber 104 is limited on its top side by a vacuum chamber top flange 113 and on the bottom side by a vacuum chamber bottom 115. The reaction chamber 103 inside the vacuum chamber 104 instead is limited on its top side by a reaction chamber top flange 114. On the bottom of the reaction chamber 103 is an exhaust line 105 extending towards a vacuum pump (not shown). FIG. 1 also shows precursor vapor in-feed lines 106 passing through the vacuum chamber bottom 115.

On top of the reaction chamber 103 is a loading chamber 102. On the side of the loading chamber 102 attached to the loading chamber 102 the deposition reactor comprises a loading port 101 for loading and unloading substrates by a loader 131. In certain example embodiments, the loading port 101 may be a gate valve, a load lock or simply a door. A substrate fits through the loading port 101 as horizontally oriented (but not as vertically oriented, in this example embodiment).

A lifting mechanism, an elevator, such as an indexing mechanism, 141 is attached to the loading chamber 102. In the example shown in FIG. 1 the lifting mechanism is attached to the top of the loading chamber 102. Within the loading chamber, a substrate holder 121 is attached to the lifting mechanism 141. Depending on the implementation, a reaction chamber lid 112 may be attached to the substrate holder 112 and/or to the lifting mechanism 141.

The lifting mechanism 141 controls the vertical position of the substrate holder 121. In an example embodiment, as shown in FIG. 1, the lifting mechanism 141 comprises a motor, such as a step motor, that moves a lifting rod 142 attached or connected to the reaction chamber lid 112 and/or to the substrate holder 121 upwards and downwards as desired. The substrate holder 121, although drawn due to drawing-specific reasons with uniform closed outlines, may be as open as possible.

Substrates 120 are loaded to and unloaded from the loading chamber 102 via the loading port 101 by the loader 131. The loader 131 may be a robot. FIG. 1 shows the loader 131 comprising an extending loading arm 132 by which the loader grips a substrate 120. The loader 131 moves the substrate 120 that is horizontally oriented through the loading port 101 into the substrate holder 121. The substrate holder 121 has suitable supports 122a and 122b to hold the substrate 120. The supports 122a are, in this example, located at the bottom of the substrate holder 121 (the bottom in this loading position pointing towards a side) and supports 122b in the middle area. The loader 131 then picks the next substrate from a storage area or shelf (not shown). The lifting mechanism 141 lowers the substrate holder 121 to the position of the next substrate. The loader 131 moves the next horizontally oriented substrate 120 through the loading port 101 into the substrate holder 121, and so on.

When all substrates have been loaded into the substrate holder 121, a vertical stack of horizontally oriented substrates has been formed within the substrate holder 121. The substrate holder 121 is then turned 90 degrees to form a horizontal stack of vertically oriented substrates. And, the substrate holder 121 is lowered into the reaction chamber 103 by the lifting mechanism 141. The turning and lowering steps are illustrated by arrows 190.

Figure 2:
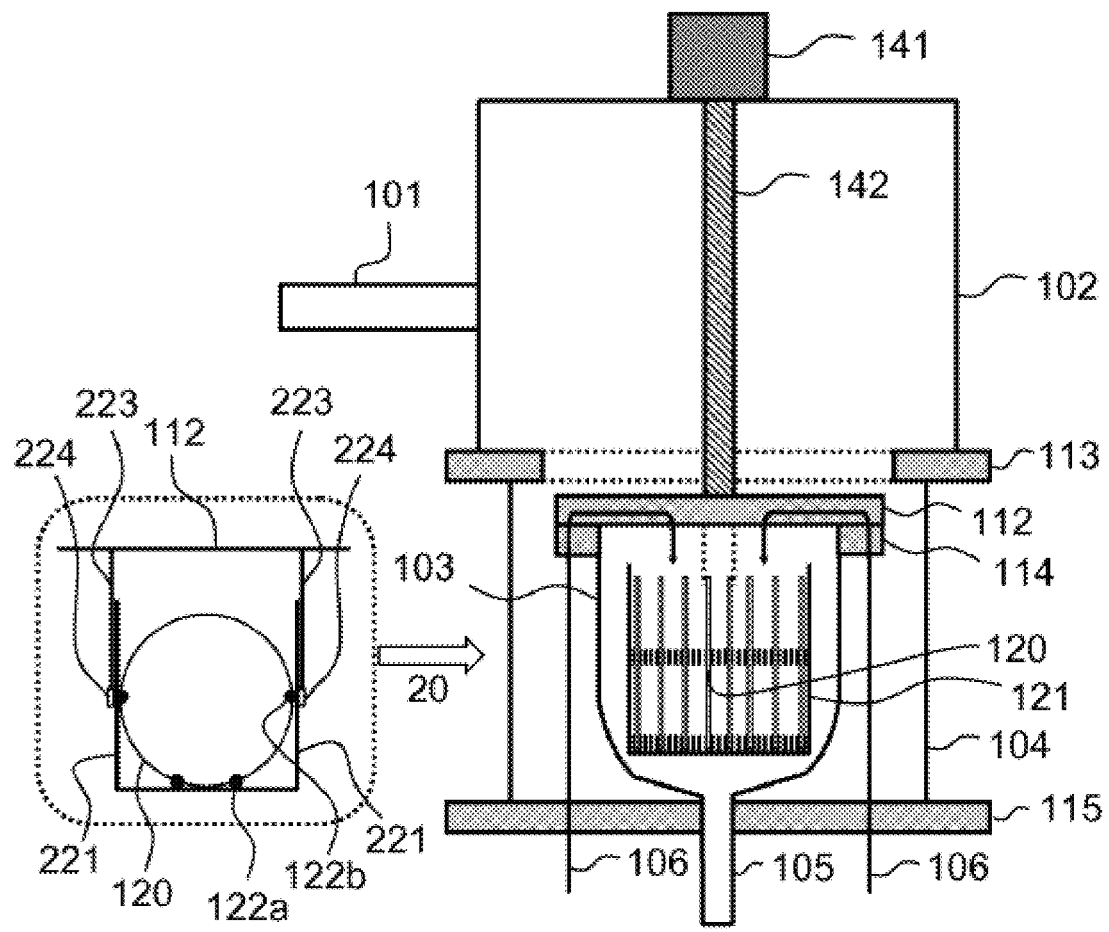
FIG. 2 shows a side view of the deposition reactor of FIG. 1 during deposition in accordance with an example embodiment.

The resulting situation is shown in the rightmost drawing of FIG. 2 which shows the deposition reactor of FIG. 1 with the lifting mechanism 141 in its lowest position. In this position the reaction chamber 103 is sealed from the top side with the lowered reaction chamber lid 112, and ALD processing may occur. However, it should be noted that it is not necessary to have the reaction chamber lid 112 attached to the lifting mechanism 141, but other ways to close the reaction chamber 103 by a lid are also possible. Further, the vacuum chamber 104 is in some example embodiments closed by a lid to separate the vacuum chamber 104 and the loading chamber 102 during ALD processing. A vacuum chamber lid for that purpose may be integrated to the lifting mechanism similarly as the reaction chamber lid 112.

The leftmost drawing of FIG. 2, on the other hand, shows a side view of the substrate holder 121 from the other side direction as depicted by arrow 20 in an example embodiment. This example embodiment illustrates an example in which the substrate holder 121 can be turned by means of rotation around a rotation axis. Hanger parts or plates 223 are attached to the reaction chamber lid 112. The substrate holder sides or side plates 221 are connected to the hanger parts or plates 223 at the point of rotation centers 224. The substrate holder is rotatable around the rotation axis defined by the rotation centers 224.

Turning back to the rightmost drawing of FIG. 2, during ALD processing, precursor vapor flows into the reaction chamber 103 from precursor vapor sources (not shown) via in-feed lines 106. In the present example, the in-feed lines 106 pass via channels arranged into the reaction chamber lid 112. The gas in-feed into the reaction chamber 103 occurs from the top of the reaction chamber 103. The flow direction within the reaction chamber 103 is from top to bottom between the vertically oriented substrates (and along the substrate surfaces) towards the exhaust line 105.

The method of turning the substrate holder 121 from a first orientation (with a vertical stack of horizontally oriented substrates) into a second orientation (with a horizontal stack of vertically oriented substrates) may occur in many alternative ways. Certain examples are shown in FIGS. 3A-3C.

Figure 3A:
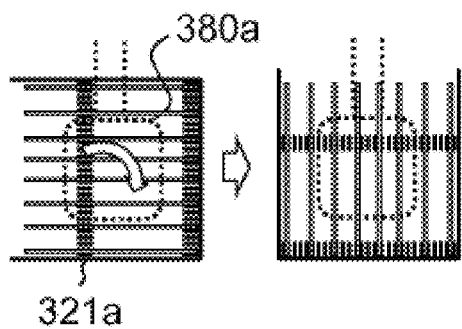
FIGS. 3A-3C show examples of turning a substrate holder within a deposition reactor in accordance with certain example embodiments.

FIG. 3A shows one rough example of turning by a rotating movement. In this example, a turning mechanism 380a has been attached to the substrate holder 321a, in FIG. 3A at the center of one or two sides of the substrate holder 321a. The turning mechanism 380a forces the substrate holder 321a to rotate 90 degrees around a joint or similar rotation center (an example has been shown in the leftmost drawing of FIG. 2).

Figure 3B:
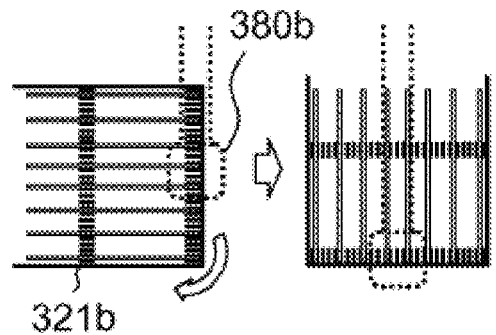
Figure 3C:
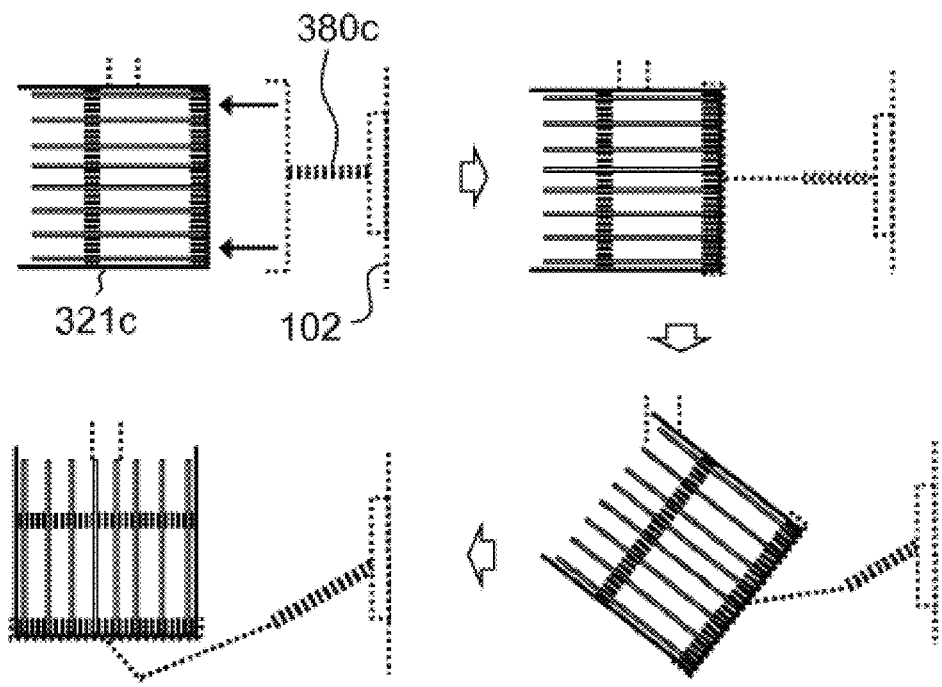

FIG. 3B shows one rough example of turning by a swing-like movement. In this example, a turning mechanism 380b has been attached to the substrate holder 321b, in FIG. 3B close to the bottom of one or two sides of the substrate holder 321b. The turning mechanism 380b forces the substrate holder 321b to turn 90 degrees by a swing-like movement around an axis defined by the turning mechanism 380b. The position of the substrate holder 321b moves in the horizontal direction due to the swing-like movement. This kind of embodiment with swing-like movement suits well for an implementation which requires a loading distance to be minimized, since the substrate holder in a loading position in this kind of embodiment is closer to the loading port than in the turned position. However, in other embodiments, the same effect is achieved, for example, by moving the substrate holder by a translational movement and then rotating as in FIG. 3A.

In the embodiments shown in FIGS. 3A and 3B the turning mechanisms may be attached to the lifting mechanism 141.

FIG. 3C shows one rough example of turning by a free movement supported by a turning mechanism. In this example, a turning mechanism 380c has been attached to the wall of the loading chamber 102. The turning mechanism 380c has a gripping part that grips the substrate holder 321c and turns it by 90 degrees.

In the preceding and further example embodiments, the substrates may be platelike substrates, such as wafers. The lifting mechanism and turning mechanism(s) may form a combined mechanism or they may be separate mechanisms. The turning and lowering of the substrate holder may occur simultaneously or one after the other.

A loader may pick up a substrate at a storage area or shelf, for example from a substrate cassette, and transfer it via a transfer chamber into the loading chamber, wherein the loader resides at least partly in the transfer chamber. The transfer chamber and the loading chamber may be in vacuum. The storage area or shelf themselves may reside in the transfer chamber or in connection with the transfer chamber.

In certain example embodiments, the loader may be a loading person or a loading device, such as a loading robot. The loader may be a single wafer loader. The loading port to the loading chamber may be, for example, simply an opening, a hatch or door, or a load lock, depending on the implementation. In certain example embodiments, a loader picks up a substrate from a loading device pick up and return station and transfers (moves) it into the loading chamber. The transfer may occur via a transfer chamber or without passing a transfer chamber. The loader may pick up the substrate from a substrate cassette. The substrates may be horizontally oriented in the cassette. In certain example embodiments, the substrates are loaded from a substrate storage carrier by an equipment front end module into the loading device pick up and return station. The substrates may first reside in a controlled environment, such as within a shield gas atmosphere (for example, nitrogen atmosphere) within the substrate storage carrier, such as a FOUP or similar. The equipment front end module unloads the substrates into the loading device pick up and return station keeping the substrates within the controlled environment (shield gas atmosphere). Alternatively, the loading device pick up and return station may be in vacuum. The transfer chamber as well as the loading chamber may be in vacuum. In alternative embodiments, the transfer chamber and the loading chamber may be in shield gas atmosphere. The loading device pick up and return station may contain the substrates horizontally oriented in a cassette. If needed, the loading device pick up and return station may be a cassette-to-cassette station which transfers substrates from one cassette to another cassette from which the loading device may better pick up the substrates one at a time. The loading device pick up and return station may form part of the transfer chamber.

Figure 4:
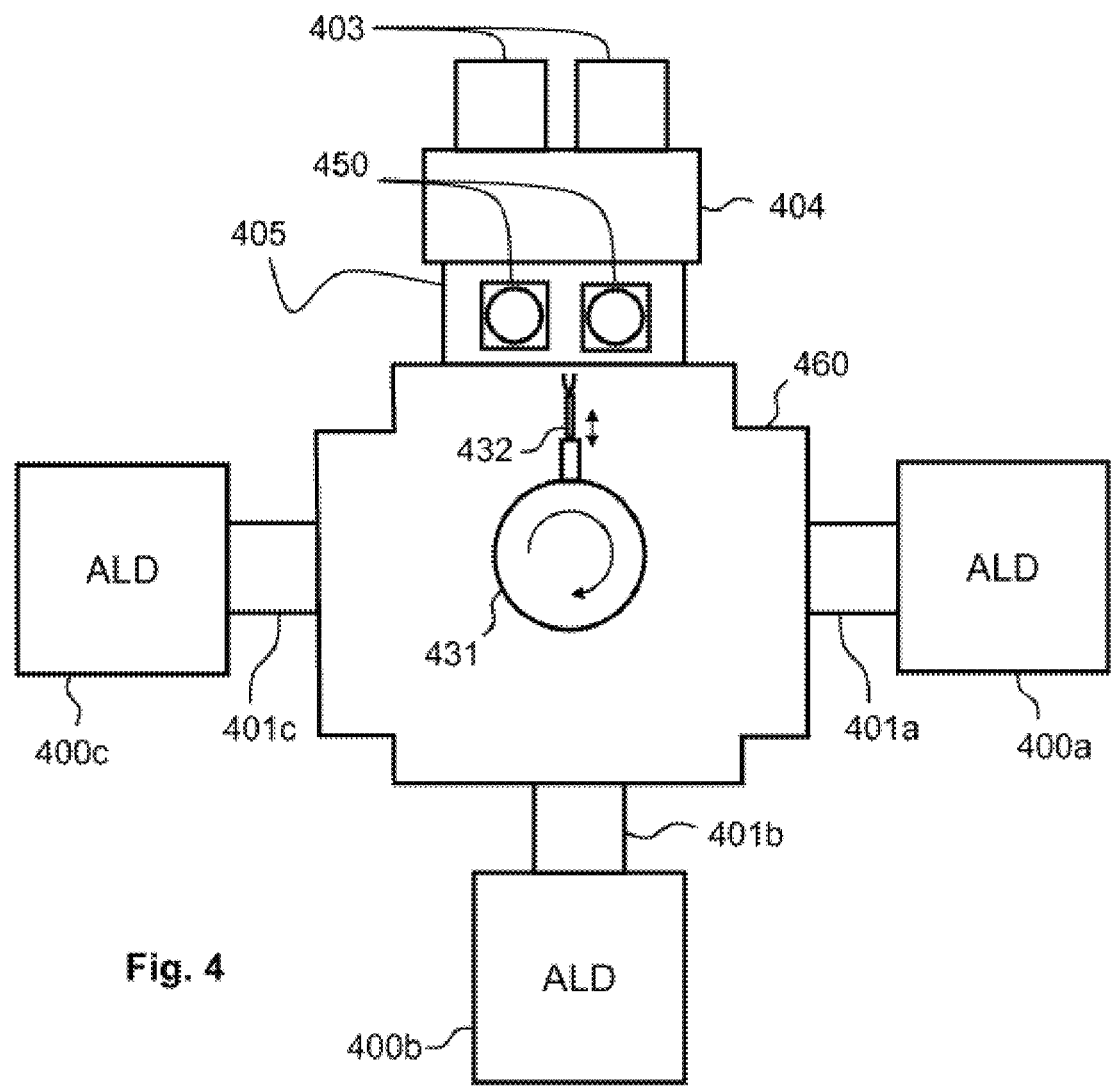
FIG. 4 shows a deposition reactor cluster in accordance with an example embodiment.

In certain example embodiments, a plurality of deposition reactors are positioned in a pre-determined pattern in relation to each other to form a reactor cluster. One such a cluster is shown in FIG. 4. In this example, the reactor cluster comprises three deposition reactors 400a, 400b and 400c. The deposition reactors are connected by loading ports 401a, 401b and 401c, respectively, to a transfer chamber 460 residing in the center area. A single substrate loader (or loading robot) 431 at least partly residing in the transfer chamber 460 is configured to load each of the deposition reactors 400a-c.

The substrates first reside in a controlled environment within an ultra-clean substrate storage carrier 403. The substrate storage carrier 403 is input into an equipment front end module 404 which unloads the substrates into a loading end device pick up and return station 405 so that the substrates remain in a controlled environment without being exposed to surrounding air. In the loading device pick up and return station 405, a loading device can pick up the substrates one at a time for loading and return them after ALD processing. Depending on the implementation, the equipment front end module 404 may handle one or more substrate storage carriers 403 simultaneously. Consequently, the loading device pick up and return station 405 may contain one or more substrate cassettes 450 at each time for the loading device to operate.

FIG. 4 shows two substrate cassettes 450 at the loading device pick up and return station 405. The substrate cassettes 450 illustrate substrate cassettes with substrates on top of each other forming a vertical stack. In an alternative embodiment, the substrates in the cassettes may be next to each other forming a horizontal stack vertically oriented substrates.

In an example embodiment, the loader 431 comprises an extending loading arm 432 (extending back and forth) by which the loader 432 grips a substrate. The loader 431 moves the substrate through the loading port 401b into a substrate holder of the first reactor 400a similarly as shown in connection with FIG. 1. Loading of the other deposition reactors 400b-c occurs similarly. If the substrate is not horizontally oriented in the beginning (vertically oriented in an alternative embodiment), the loader 431 turns the substrate into a horizontal position before entering the loading port 401a. For that purpose, the extending arm 432 of the loader 431 may be rotatable. The loader 431 itself is also rotatable. It may also be capable of translational movement. In a more advanced embodiment, a loader comprises a joint or similar at which an arm can be turned downwards so that the loader can pick up substrates, for example, from the top side of a substrate cassette (in addition of being capable of picking them from a side).

In certain example embodiments, the loading device pick up and return station 405, the transfer chamber 460 and the loading chambers of the deposition reactors 400a-c are in vacuum. The system may be a fully automatic system. In a less sophisticated system, the loading ports 401a-c are implemented as load locks, and the substrates are loaded into the loading chambers of reactors 400a-c manually. The transfer chamber 460 can be omitted, and the loading chambers may be pumped into vacuum as desired.

Figure 5:
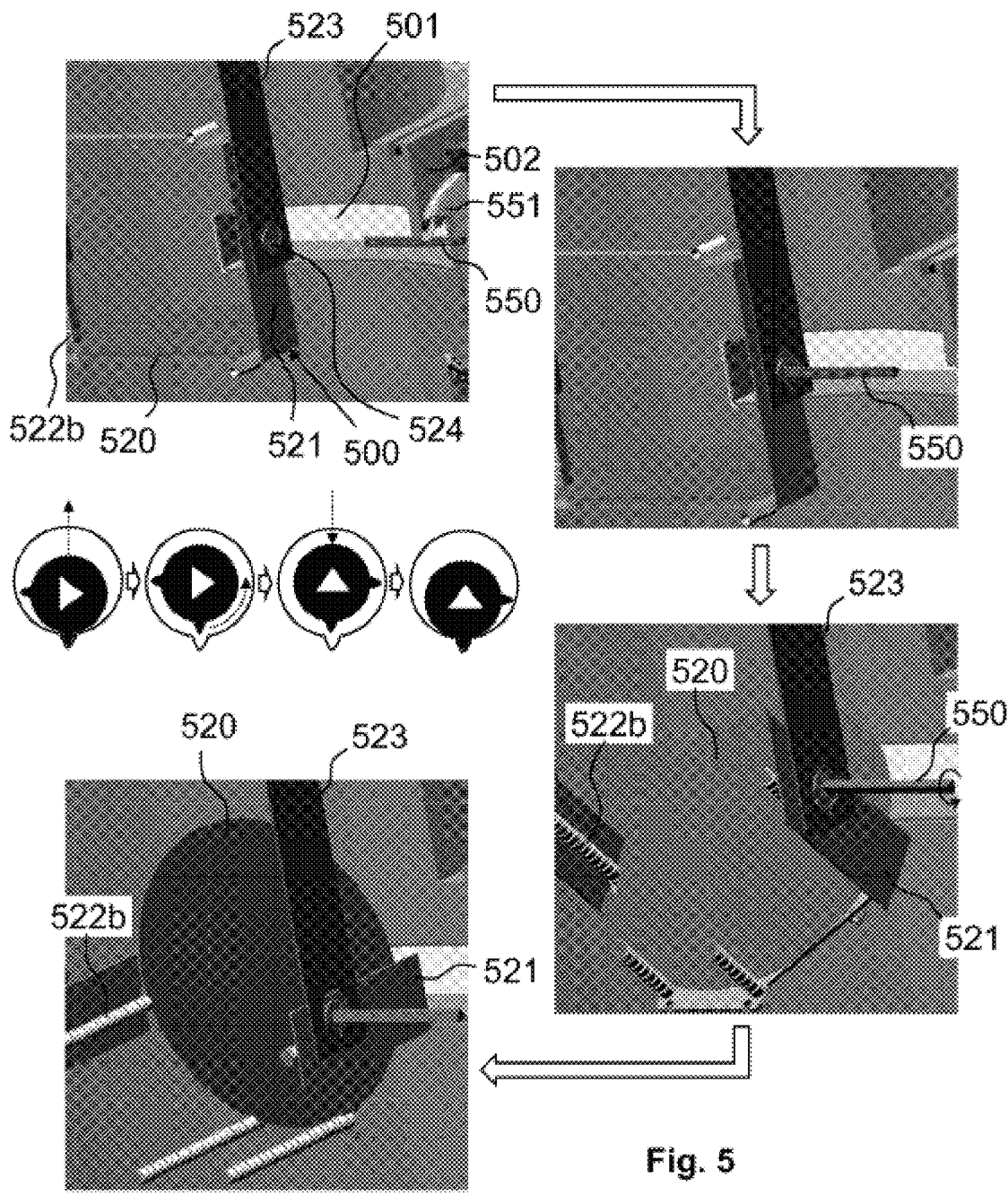
FIG. 5 shows turning of a substrate holder in accordance with a specific example embodiment.

FIG. 5 shows turning of a substrate holder 500 within a loading chamber 502 in accordance with a specific example embodiment. In this example embodiment, substrates 520 are received horizontally oriented into the loading chamber 502 via a loading port 501. The elevator (not shown) lifts or lowers the substrate holder 500 so that each substrate 520 in turn can be pushed to its place. The substrates 520 are supported by supports in the substrate holder 500 similarly as shown in FIGS. 1 and 2. The supports 522b (corresponding to supports 122b in FIGS. 1 and 2) are partly shown in the top-left drawing of FIG. 5.

Hanger plates 523 (one of which is shown in FIG. 5) are attached to a reaction chamber lid (not shown). The substrate holder side plates 521 (one of which is shown in FIG. 5) are connected to the hanger plates 523 at the point of rotation centers 524 (one of which is shown in FIG. 5). The substrate holder is rotatable around the rotation axis defined by the rotation centers 524. An actuator pin 550 is pushed through the sidewall of the loading chamber 502 at the point of a loading chamber wall feedthrough 551. The shaped end plug of the actuator pin 550 is pushed into a correspondingly shaped socket in the rotation center 524 as illustrated in the top-right drawing of FIG. 5. A corresponding pin (not shown) is pushed into the rotation center of the opposite side of the substrate holder 500. The substrate holder 500 is rotated by turning one or both of the actuator pins 550, as depicted by the arrow in the bottom-right drawing of FIG. 5. The bottom-right drawing of FIG. 5 illustrates the position in which the substrate holder 500 has turned around 45 degrees, and the bottom-left drawing of FIG. 5 the position in which the substrate holder 500 has turned around 90 degrees to form a horizontal stack of vertically oriented substrates.

The rotating action in an example embodiment is illustrated in more detail in the magnification picture set between the top-left and bottom-left drawings. The magnification picture set shows in black colour the rotation center 524 with the socket. The rotation center 524 further comprises two fins, at the interval of 90 degrees. The rotation center 524 is located in a hole of the hanger plate 523. In the top-left drawing of FIG. 5, the first fin of the rotation center 524 is in a side slot of the hanger plate hole locking the substrate holder 500 in its initial position. The hole is slightly larger than the rotation center 524. In the next phase the reaction chamber elevator (see FIGS. 1 and 2) lowers the hanger plates 523 with respect to the substrate holder side plates 521 that remain in their previous vertical position due to the actuator pins pushing from the sides. This movement frees the rotation centers 524 so that they can be rotated. The actuator pins 550 now turn the substrate holder 90 degrees. In the last phase, the reaction chamber elevator lifts the hanger plates 523 with respect to the substrate holder side plates 521 so that the second fin of the rotation center 524 moves into the side slot thereby locking the substrate holder 500 into the 90 degrees turned position.

The actuator pins may be pneumatic. Two actuator pins can support the substrate holder so that one actuator pin supports the substrate holder on a first side and the other on the opposite side. The actuators may be designed to be of another shape depending on the implementation. In certain embodiments, the loading chamber wall feedthrough 551 is a rotation feedthrough. The bearings for the rotation movement are placed on the outside of the loading chamber.

Figure 6:
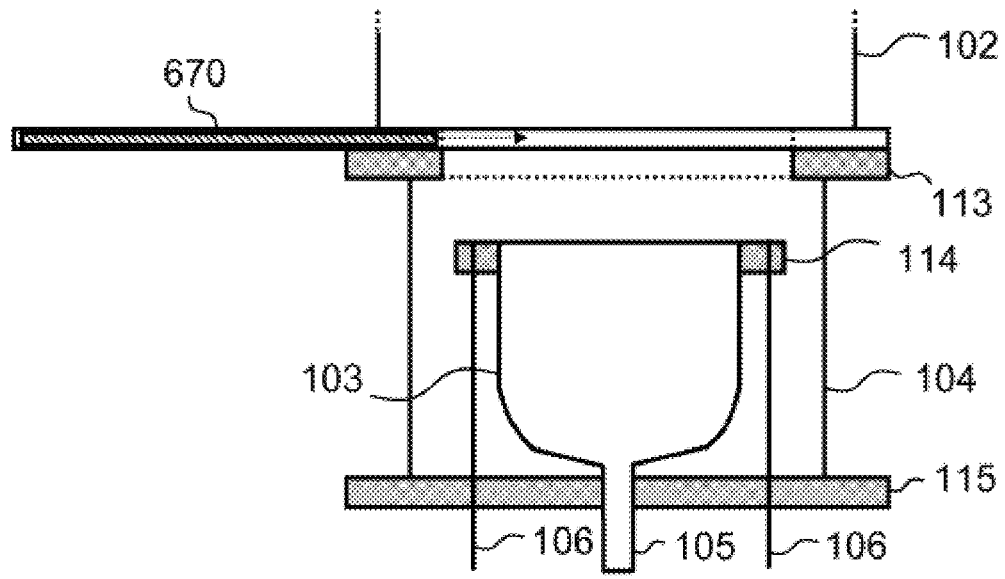
FIG. 6 shows a side view of a deposition reactor in accordance with yet another example embodiment.
Figure 6:
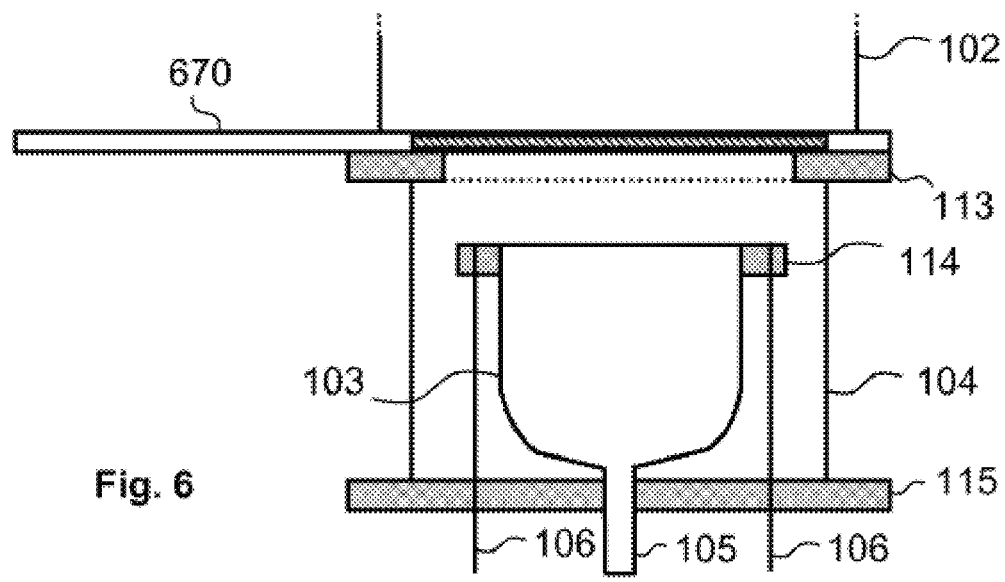

FIG. 6 shows a side view of a deposition reactor in accordance with yet another example embodiment. In this embodiment, the deposition reactor comprises a gate 670 between the loading chamber 102 and the reaction chamber 103. This may be in order to reduce cooling of the reaction chamber 103 during the loading of the substrates into the loading chamber 102 that resides on top of the reaction chamber 103. The gate 670 may be a gate valve. The gate 670 may be in a closed position during the loading of the substrates into the loading chamber 102 as depicted by the lower drawing of FIG. 6. Upon completion of the loading, the gate 670 is opened (as depicted by the upper drawing of FIG. 6) to allow the loaded substrate batch to be lowered into the reaction chamber 103. Otherwise, concerning the structure and operation of the embodiment shown in FIG. 6 reference is made to the embodiments shown in FIGS. 1 and 2.

Without limiting the scope and interpretation of the patent claims, certain technical effects of one or more of the example embodiments disclosed herein are listed in the following: A technical effect is a top loading system for a vertical flow deposition reactor in which the substrates can be loaded as horizontally oriented. Another technical effect is eliminating the need for flipping each substrate separately by flipping the whole substrate holder (especially, if the substrates are stored horizontally oriented). Another technical effect is minimizing a loading distance in a reactor cluster.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A method comprising:
providing a plurality of substrates within a deposition substrate holder in a loading chamber of a deposition reactor, the substrates forming a vertical stack of horizontally oriented substrates within said deposition substrate holder;
providing a feedthrough through a loading chamber wall for an actuator to enter the loading chamber;
pushing the actuator through the loading chamber wall at the point of the loading chamber wall feedthrough and accessing within the loading chamber the deposition substrate holder from a side by the actuator; and
turning the deposition substrate holder by the actuator to form a horizontal stack of vertically oriented substrates.

2. The method of claim 1, comprising:
accessing the deposition substrate holder by two actuators, from opposite sides.

3. The method of claim 1, comprising:
turning the deposition substrate holder in vacuum.

4. The method of claim 1, comprising:
loading a plurality of substrates, horizontally oriented, into the deposition substrate holder in the loading chamber in vacuum.

5. The method of claim 1, comprising:
moving the substrates from a transfer chamber to the loading chamber.

6. The method of claim 1, comprising:
rotating the deposition substrate holder around a rotation axis defined by rotation centers.

7. The method of claim 1, comprising:
rotating the deposition substrate holder around a rotation axis by turning an actuator pin.

8. The method of claim 1, providing means for locking the deposition substrate holder at the interval of 90 degrees.

9. The method of claim 1, wherein the deposition reactor is an atomic layer deposition reactor.

10. An apparatus comprising:
a loading chamber in a deposition reactor;
a deposition substrate holder configured to hold a vertical stack of horizontally oriented substrates within said deposition substrate holder in the loading chamber, the apparatus further comprising:

a feedthrough through a loading chamber wall for the actuator to enter the loading chamber; and an actuator to access within the loading chamber the deposition substrate holder from a side, the actuator being configured to be pushed through the loading chamber wall at the point of the loading chamber wall feedthrough and to turn the deposition substrate holder to form a horizontal stack of vertically oriented substrates.

11. The apparatus of claim 10, comprising:

two actuators for accessing the deposition substrate holder from opposite sides.

12. The apparatus of claim 10, wherein the apparatus is configured to turn the deposition substrate holder in vacuum.

13. The apparatus of claim 10, wherein the apparatus is configured to load a plurality of substrates, horizontally oriented, into the deposition substrate holder in the loading chamber in vacuum.

14. The apparatus of claim 10, comprising:

a transfer chamber, the apparatus being configured to move the substrates from the transfer chamber to the loading chamber.

15. The apparatus of claim 10, comprising:

rotation centers defining a rotation axis to rotate the deposition substrate holder around the rotation axis.

16. The apparatus of claim 10 comprising:

actuator pin(s) to rotate the deposition substrate holder around a rotation axis.

17. The apparatus of claim 10, comprising:

means for locking the deposition substrate holder at the interval of 90 degrees.

18. The apparatus of claim 10, wherein the apparatus is an atomic layer deposition reactor.

* * * * *